April 14, 1970 W. W. GRAY ET AL 3,506,878

APPARATUS FOR MOUNTING MINIATURE ELECTRONIC COMPONENTS

Filed Sept. 26, 1968

William W. Gray,
Richard J. Wagner,
INVENTORS.
BY.
[signature]
ATTORNEY.

3,506,878

APPARATUS FOR MOUNTING MINIATURE ELECTRONIC COMPONENTS

William W. Gray, Manhattan Beach, and Richard J. Wagner, Los Angeles, Calif., assignors to Hughes Aircraft Company, Culver City, Calif., a corporation of Delaware Filed Sept. 26, 1968, Ser. No. 762,953
Int. Cl. H01l 1/12
U.S. Cl. 317—100 8 Claims

ABSTRACT OF THE DISCLOSURE

An improved method and apparatus for mounting miniature electronic components such as microwave diodes for increased power dissipation. The miniature electronic component is held in intimate thermal and electrical contact with a base block and lead strap by a jaw-like member of thermally conductive dielectric material. To insure greater thermal conduction from the component to the base block and dielectric member, the contacting surfaces are first coated with a thin layer of soft solder. Substantially constant clamping force in the presence of thermal expansion of the component is provided by an adjustable spring coupling between the mounting base and the dielectric member.

FIELD OF THE INVENTION

This invention relates to miniature and microminiature electronic components, and more specifically to methods and apparatus for mounting such components for improved power dissipation.

DESCRIPTION OF THE PRIOR ART

It is well-recognized that one of the problems frequently encountered with most electronic components is that of overheating. Overheating can occur in the process of mounting the component, such as by soldering, and also during normal operation such as by resistive heating, thermal conduction or thermal radiation from nearby components. Because of their small size and high power density operation, miniature or microminiature components are especially susceptible to overheating. If maximum design temperatures are exceeded, the electrical characteristics of these components are affected, either temporarily or permanently. In the case of extreme overheating total failure of the component generally occurs.

Several approaches to the elimination of overheating and its associated problems are available. For example, in the case of large components, a circulating fluid is frequently used to provide cooling. Radiating fins or the like have also been used with large, as well as small, components. With miniature or microminiature electronic components, the most common approach is the use of a heat sink consisting of a relatively massive block of thermally conductive material in thermal contact with the component. Of course, some or all of the above techniques are frequently employed simultaneously. For example, the massive block type heat sink can be provided with fins which, in turn, are placed in the path of circulating coolant.

It is an object of the present invention to provide apparatus for mounting miniature electronic components for improved heat sinking capability.

Because many miniature and microminiature electronic components are mounted in or upon planar circuit boards, it is desirable that the heat sinking techniques be compatible therewith. Such circuit boards are commonly called printed circuits, or, in the case of microwave circuits, "microstrip circuits." In general, such circuits comprise a dielectric substrate upon which thin ribbons of conductive material are bonded. Some of the electronic components, such as resistors, inductors and capacitors, for example, can be integrated into the ribbon-like conductors themselves. In the case of other components it may be advantageous or necessary to insert them into the circuit by means of sockets, lead wires or other mounting means.

It is therefore another object of the present invention to provide an improved method for mounting miniature electronic components in circuits of the printed or microstrip variety.

At the present time much attention is being focused on the problem of improving the heat dissipation of solid state microwave diodes. These miniature devices, when used for the generation of microwave power, generally dissipate many watts of heat for each watt of generated output power. It is because of their stringent heat dissipation requirements that the present invention will be described in connection with such devices. It is understood, however, that the present invention is also applicable to other miniature and microminiature components of diverse types.

Most of the mounting techniques used heretofore with solid state microwave diodes have involved some form of thermal bonding of the device to the massive block heat sink at elevated temperatures. Such techniques have included the use of high temperature solder often in conjunction with relatively high compressive forces. As mentioned hereinabove, high temperatures, whether they occur during mounting or during normal operation, can adversely affect the electrical characteristics of such devices.

Accordingly, it is another object of the present invention to provide a mount for miniature electronic components requiring no high temperature bonding operations.

SUMMARY OF THE INVENTION

In accordance with the principles of the present invention, these objects are accomplished by pressure mounting the miniature components on a thermally conductive base block. The surface of the block upon which the component is to be mounted is first finished for smoothness and then "tinned" with a thin layer of soft solder. The component is placed on the "tinned" block and a strap-like conductive lead which is also "tinned" with soft solder is placed over the component. A jaw-like dielectric member also having a high thermal conductivity is then placed over the "tinned" strap-like lead.

The dielectric member is then tightened by a screw adjustment acting through a compression member such as a spring. As the clamping pressure is increased, the soft solder cold flows over and between the contacting surfaces. The union thereby formed between the contacting surfaces of the component with the heat sink and the strap-like lead is characterized by very high thermal and electrical conductivity. Electrical coupling to the component is provided at one end through the strap-like lead and through the other end by the return path provided by the block.

BRIEF DESCRIPTION OF THE DRAWINGS

In order that the invention may be more clearly understood and readily carried into effect, it will now be described with reference by way of example to the accompanying drawing, in which.

DESCRIPTION OF THE PREFERRED EMBODIMENTS

Figures 1, 2:
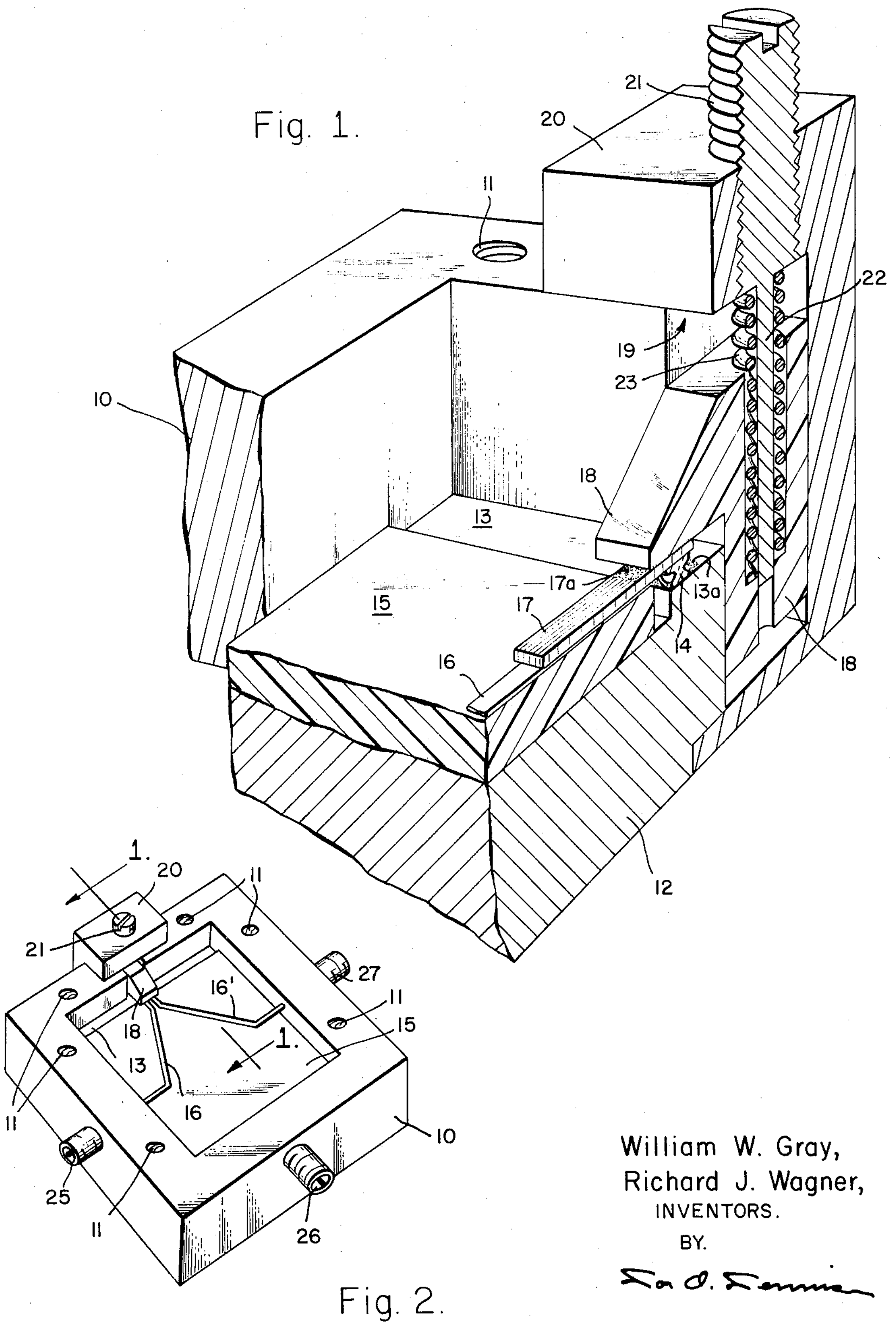
FIG. 1 is a broken-away pictorial view partially in cross-section, of a preferred embodiment of the present invention.
FIG. 2 is a pictorial representation of an assembled microstrip circuit utilizing the embodiment of FIG. 1.

Referring more specifically to the drawings, FIG. 1 is an enlarged pictorial view of a preferred embodiment of the present invention. To facilitate description, the embodiment of FIG. 1 is shown partially in cross-section and partially broken away. An assembled view of a typical microstrip circuit incorporating the embodiment of FIG. 1 is shown pictorially in FIG. 2.

In FIG. 1, a thick-walled rectangular supporting frame 10, fabricated of electrically conductive material such as copper, brass, aluminum, or the like, serves as the framework upon which the other elements are mounted. Frame 10, in combination with an upper cover plate, also serves as an electromagnetic shield for the microstrip circuit. The upper cover plate is not shown but is adapted to fit over frame 10 to which it is secured by means of screws for which threaded holes 11 are provided.

A base block 12 of material such as copper, having both a high thermal conductivity and high electrical conductivity is mounted on the bottom of supporting member 10 by suitable mounting or bonding means to insure good mechanical and electrical union. It is possible, of course, to fabricate supporting frame 10 and base block 12 from a single piece of material, although it is generally more practical to form them separately and then assemble them.

In either event, the upper surface of base block 12 is provided with a smooth finish. Block 12 is provided with a raised lip 13 along an edge thereof adjacent the inner surface of supporting frame 10. Lip 13 is not an indispensible structural detail, but as can be seen from FIG. 1, merely serves as a pedestal upon which the miniature electronic component is mounted. Substrate 15, comprising a thin sheet or layer of low loss dielectric material, such as alumina, is disposed upon and bonded to the upper surface of block 12. The ribbon-like strips of conductive material, such as strip 16, in turn, are disposed upon and bonded to the upper surface of block 12. The ribbon-like strips of conductive material, such as strip 16, in turn, are disposed upon and bonded to the upper surface of substrate 15 by methods well-known in the art to form the microstrip circuit.

As mentioned hereinabove, some of the commonly encountered miniature or microminiature components which are readily adapted for mounting in accordance with the present invention are microwave diodes. For this reason, the component shown in the embodiment of FIG. 1 is depicted as a mesa diode 14. It is obvious, of course, that this is merely illustrative of one possible component and that many others of diverse types can be suitably mounted in accordance with the present teachings.

It is generally recognized that power dissipation and heat sinking is best achieved with mesa diodes by mounting the mesa side of the diode on the heat sink. This is due to the fact the heat generation region of such diodes is near its mesa end. Thus, although such diodes are normally pictured with a base at the bottom and mesa at the top, in FIG. 1, the mesa is mounted on lip 13 of the base block 12 with the base of the diode extending upward. The region 13*a* of lip 13 upon which diode 14 is mounted is first tinned with a soft solder such as indium.

Extending between the upper surface of strip 16 and the upper surface (i.e., base) of diode 14 is a flexible strap 17 of thermally and electrically conductive material, such as copper. Strap 17 can be advantageously bonded to strip 16 by means of conventional tin-lead solder or other well-known bonding material. However, the end 17*a* of strap 17, adjacent diode 14, is preferably tinned with a soft solder such as indium.

A moveable jaw-like member 18, fabricated of a low-loss dielectric material having a high thermal conductivity is disposed against the upper surface of strap 17. Materials suitable for the fabrication of member 18 include boron nitride (BN), beryllia (BeO), or alumina ($Al_2O_3$).

A vertical slot 19 is provided in supporting frame 10 to allow vertical movement of member 18 while preventing lateral or rotational movement. A "C-shaped" block 20 of conductive material such as brass or copper, for example, is disposed around the outside of supporting frame 10. An adjusting screw 21 extends through a tapped hole in the upper portion of block 20. A lower extension 22 of screw 21 extends downwardly through a vertical hole in member 18. A helical compression spring 23 surrounding screw extension 22 extends between the lower surface of the upper portion of block 20 through an enlarged region of the vertical hole formed in jaw 18.

The combination of screw 21 and spring 23 thereby provides an adjustable vertical force which is transmitted through jaw-like member 18 to clamp strip 17 and diode 14 to block 12. Once adjusted, the clamping force provided by member 18 remains substantially constant even though thermal expansion or contraction of either the diode 14, member 18 or other structural members may take place. As diode 14 expands or contracts due to thermal excursions, member 18 merely slides up or down in slot 19.

In the case of some components the clamping or mounting pressure has an effect upon their operating properties. For example, the breakdown voltage and oscillating frequency of avalanche diodes are known to vary with changes in pressure. With such diodes, therefore, it is generally desirable to maintain the mounting force substantially constant. If rigid mounting means or a very stiff elastic member is used to hold the component in place operation can be impaired. In keeping with the practice of the present invention, changes in clamping force occasioned by thermal expansion can be minimized by utilizing a spring 23 with a relatively low spring constant.

Referring more specifically to the pictorial view of FIG. 2, there is depicted an assembled microstrip circuit shown with its upper cover plate removed for the sake of clarity. Since the embodiment of FIG. 1 represents a broken-away cross-section of the microstrip circuit of FIG. 2, reference numerals have been carried over where appropriate.

In the structure of FIG. 2, ribbon-like conductive strips 16 and 16' are not intended to represent any particular circuit arrangement, but merely exemplify a microstrip circuit with which the present invention can be advantageously utilized. Standard coaxial connectors 25, 26 and 27 are provided around rectangular supporting frame 10 to facilitate connection of the microstrip circuit to other external circuits, components or utilization devices, not shown. The outer conductors of coaxial connectors 25, 26 and 27 are conductively joined to supporting frame 10, and the inner conductors to the center conductive strips of the microstrip circuit. Direct current biasing potentials can be applied to the microstrip circuit, if needed, by means of the inner conductors of the coaxial connectors, or by means of appropriate feed-through insulators provided through frame 10.

In all cases it is understood that the above-described arrangements are illustrative of but a small number of many specific embodiments which can represent applications of the principles of the present invention. Numerous and varied other arrangements can be readily devised in accordance with these principles by those skilled in the art without departing from the spirit and scope of the invention.

What is claimed is:

1. A mounting structure for heat sinking miniature electronic components comprising, in combination, a base block of electrically conductive material, said material having a relatively high thermal conductivity;

a sheet of dielectric material disposed upon and bonded to said base block to cover a substantial portion of a surface thereof;

a region of the surface of said base block not covered by said dielectric sheet being coated with a thin layer of soft solder;

at least one ribbon-like conductor disposed on and bonded to said dielectric sheet on the side thereof opposite said base block;

a flexible strap of conductive material having one end region thereof conductively attached to said ribbon-like conductor, the other end region of said strap being coated with a thin layer of soft solder and extending over said coated region of said base block;

a miniature electronic component disposed on said coated region of said base block and beneath said coated end region of said strap;

a jaw of dielectric material having a relatively high thermal conductivity, said jaw being slideably mounted for linear motion normal to the coated region of said base block, a surface of said jaw in contact with said coated end region of said strap on a side thereof opposite said component; and adjustable resilient means, said resilient means being mechanically coupled between said jaw and said base block for holding said strap, component and base block under compressive force.

2. The mounting structure according to claim 1 wherein said base block material is copper.

3. The mounting structure according to claim 1 wherein the material of said dielectric sheet is alumina.

4. The mounting structure according to claim 1 wherein said soft solder is indium.

5. The mounting structure according to claim 1, with the dielectric material of said jaw being selected from the group consisting of boron nitride, beryllia and alumina.

6. The mounting structure according to claim 1 wherein said component comprises a microwave diode.

7. The mounting structure according to claim 1 wherein said component comprises a mesa diode.

8. The mounting structure according to claim 7 wherein the mesa end of said mesa diode is disposed on said coated region of said base block.

References Cited

UNITED STATES PATENTS

| | | | |
|---|---|---|---|
| 2,815,472 | 12/1957 | Jackson | 317—100 X |
| 3,296,506 | 1/1967 | Steinmetz | 317—235 |
| 3,351,698 | 11/1967 | Marinace | 317—100 X |

DARRELL L. CLAY, Primary Examiner

G. P. TOLIN, Assistant Examiner

U.S. Cl. X.R.

317—234